United States Patent
Ishibashi

(10) Patent No.: US 9,391,307 B2
(45) Date of Patent: Jul. 12, 2016

(54) ELECTRONIC DEVICE

(71) Applicant: CASIO COMPUTER CO., LTD., Shibuya-ku, Tokyo (JP)

(72) Inventor: Jumpei Ishibashi, Nishitokyo (JP)

(73) Assignee: CASIO COMPUTER CO., LTD., Tokyo (JP)

( * ) Notice: Subject to any disclaimer, the term of this patent is extended or adjusted under 35 U.S.C. 154(b) by 15 days.

(21) Appl. No.: 14/475,162

(22) Filed: Sep. 2, 2014

(65) Prior Publication Data
US 2015/0077912 A1 Mar. 19, 2015

(30) Foreign Application Priority Data

Sep. 17, 2013 (JP) ................................. 2013-191942

(51) Int. Cl.
| | |
|---|---|
| *G06F 1/16* | (2006.01) |
| *H01M 2/12* | (2006.01) |
| *H05K 5/00* | (2006.01) |
| *H05K 5/02* | (2006.01) |
| *H01M 2/10* | (2006.01) |
| *G04C 10/00* | (2006.01) |
| *G04G 17/08* | (2006.01) |

(52) U.S. Cl.
CPC .............. *H01M 2/1241* (2013.01); *G04C 10/00* (2013.01); *G04G 17/08* (2013.01); *G06F 1/163* (2013.01); *H01M 2/1066* (2013.01); *H05K 5/0095* (2013.01); *H05K 5/0217* (2013.01)

(58) Field of Classification Search
CPC ......... G06F 1/16; G06F 1/163; H05K 5/0095; H05K 5/0217; H01M 2/1241; H01M 2/1066; G04C 10/00; G04G 17/08
USPC ............. 361/679.55–679.58, 679.01, 679.02, 361/679.21, 679.26, 679.27, 679.03; 455/575.1–575.4
See application file for complete search history.

(56) References Cited

U.S. PATENT DOCUMENTS

| | | | | |
|---|---|---|---|---|
| 4,083,177 | A * | 4/1978 | Nishimura | G02F 1/13452 361/679.03 |
| 7,145,766 | B2 * | 12/2006 | Homer | G06F 1/1616 345/173 |
| 7,906,232 | B2 | 3/2011 | Tanaka | |
| 8,420,246 | B2 * | 4/2013 | Lai | H01M 6/06 361/679.1 |
| 2001/0004397 | A1 | 6/2001 | Kita et al. | |
| 2008/0210843 | A1 * | 9/2008 | Han | H05K 5/0213 361/679.01 |
| 2011/0235274 | A1 * | 9/2011 | Gu | H05K 5/0017 361/692 |

(Continued)

FOREIGN PATENT DOCUMENTS

| | | | |
|---|---|---|---|
| JP | 55049714 | A | 4/1980 |
| JP | 5549714 | B2 | 12/1980 |
| JP | 58078685 | U | 5/1983 |

(Continued)

*Primary Examiner* — Anthony Haughton
*Assistant Examiner* — Ingrid Wright
(74) *Attorney, Agent, or Firm* — Holtz, Holtz & Volek PC

(57) ABSTRACT

An electronic device includes a case body which includes an opening and a battery holder holding a battery, an inward flange which is disposed at least a part of a circumference of the opening, a display panel which is mounted on the inward flange so as to cover the opening of the case body, and an adhesive layer which is provided between the display panel and the inward flange. The adhesive layer gradually peels off to leak gas in a space sealed by the case body and the display panel, so as to prevent the display panel from swiftly popping out of the opening when an inner pressure of the space increases.

20 Claims, 5 Drawing Sheets

(56) References Cited

U.S. PATENT DOCUMENTS

2012/0050640 A1* 3/2012 Yasui ................ G02F 1/133308
                                                    349/60
2013/0021303 A1* 1/2013 Martin .................. G06F 1/3262
                                                   345/178
2013/0129119 A1    5/2013 Miyatake et al.

FOREIGN PATENT DOCUMENTS

| JP | 11193073 A | 7/1999 |
| JP | 2001177889 A | 6/2001 |
| JP | 2001354276 A | 12/2001 |
| JP | 2006236863 A | 9/2006 |
| JP | 2012039272 A | 2/2012 |

* cited by examiner

ELECTRONIC DEVICE

CROSS REFERENCE TO RELATED APPLICATION

This application is based upon and claims the benefit of priority under 35 USC 119 of Japanese Patent Application No. 2013-191942 filed on Sep. 17, 2013, the entire disclosure of which, including the description, claims, drawings and abstract, is incorporated herein by reference in its entirety.

BACKGROUND OF THE INVENTION

1. Field of the Invention

The present invention relates to an electronic device.

2. Description of Related Art

Portable terminal devices have been known in the art. For example, JP 2001-177889A discloses a wearable music player that comprises a band member for fitting the device body on a user body, and is capable of playing music based on music data while being fitted on the body.

In recent years, there have been known portable terminal devices for sports that measure and display biological information such as heart rate and pulse rate and exercise information such as exercise time, distance and pace when playing a sport or the like.

Such portable terminal devices are equipped with a secondary battery such as lithium-ion battery as a means for supplying an electric power necessary for operating components of the devices.

Secondary batteries such as lithium-ion batteries are rechargeable and also have high capacity with a comparatively small size. Accordingly, they enable small terminal devices, which have a limited room, to secure an electric power necessary for executing different measurement processing and display processing.

However, secondary batteries such as lithium-ion batteries may produce gas when they are subjected to an external impact or pressure or are deformed, e.g. devices are dropped on a floor by mistake with a battery installed, or when they are exposed to a severe temperature change (e.g. they are left in a high-temperature environment for a long time).

The gas produced from a battery can be released, if there is a small gap.

In this regard, most conventional devices equipped with a lithium-ion battery or the like are configured such that, even if gas is produced from the lithium-ion battery or the like, it can be released from a narrow gap. For example, digital cameras and the like are designed such that the battery is exchangeable, and therefore include a battery cover that is opened and closed every time the battery is exchanged. Further, cellphones and the like include a gas-permeable membrane for a speaker or a microphone.

Even in a device having high air-tightness and waterproofness, there is a room inside the device to which gas produced from the battery can be released as long as the size of the device itself is sufficiently large with respect to the size of the battery, which prevents the inner pressure from rising to such a high level to cause rupture of the device.

On the other hand, portable terminal devices for sports are supposed to be exposed to sweat, rain and the like, and therefore require high waterproofness. Moreover, the size of such devices are as small as that of wristwatches, and even a narrow gap is not permitted if they are designed to have a highly airtight structure in order to improve the waterproofness.

When gas is produced from the lithium-ion battery or the like, it increases the inner pressure of a case. In the worst case, the increased pressure may break a case body or a display panel, or may blow off the display panel or the like that covers an opening of the case, which may result in an accident such as injury of a user wearing the device or a person near the device.

SUMMARY OF THE INVENTION

The present invention was made in view of the above-described circumstances, and an object thereof is to provide an electronic device with a simple configuration that can maintain air-tightness of the inside of the case while it can prevent an accident caused by a rise of the inner pressure when gas is produced from a battery.

In order to achieve at least one of the objects, according to a first aspect of the present invention, there is provided an electronic device including: a case body which includes an opening and a battery holder holding a battery; an inward flange which is disposed at least apart of a circumference of the opening; a display panel which is mounted on the inward flange so as to cover the opening of the case body; and an adhesive layer which is provided between the display panel and the inward flange, wherein the adhesive layer gradually peels off to leak gas in a space sealed by the case body and the display panel, so as to prevent the display panel from swiftly popping out of the opening when an inner pressure of the space increases.

BRIEF DESCRIPTION OF THE DRAWINGS

The present invention will become more fully understood from the detailed description given hereinafter and the appended drawings, which are given by way of illustration only and thus are not intended as a definition of the limits of the present invention, wherein.

DETAILED DESCRIPTION OF THE PREFERRED EMBODIMENT

An embodiment of an electronic device according to the present invention will be described referring to FIGS. 1 through 4. This embodiment is an example of an electronic device which is a wristwatch electronic terminal device for sports that is worn around a wrist.

Figure 1:
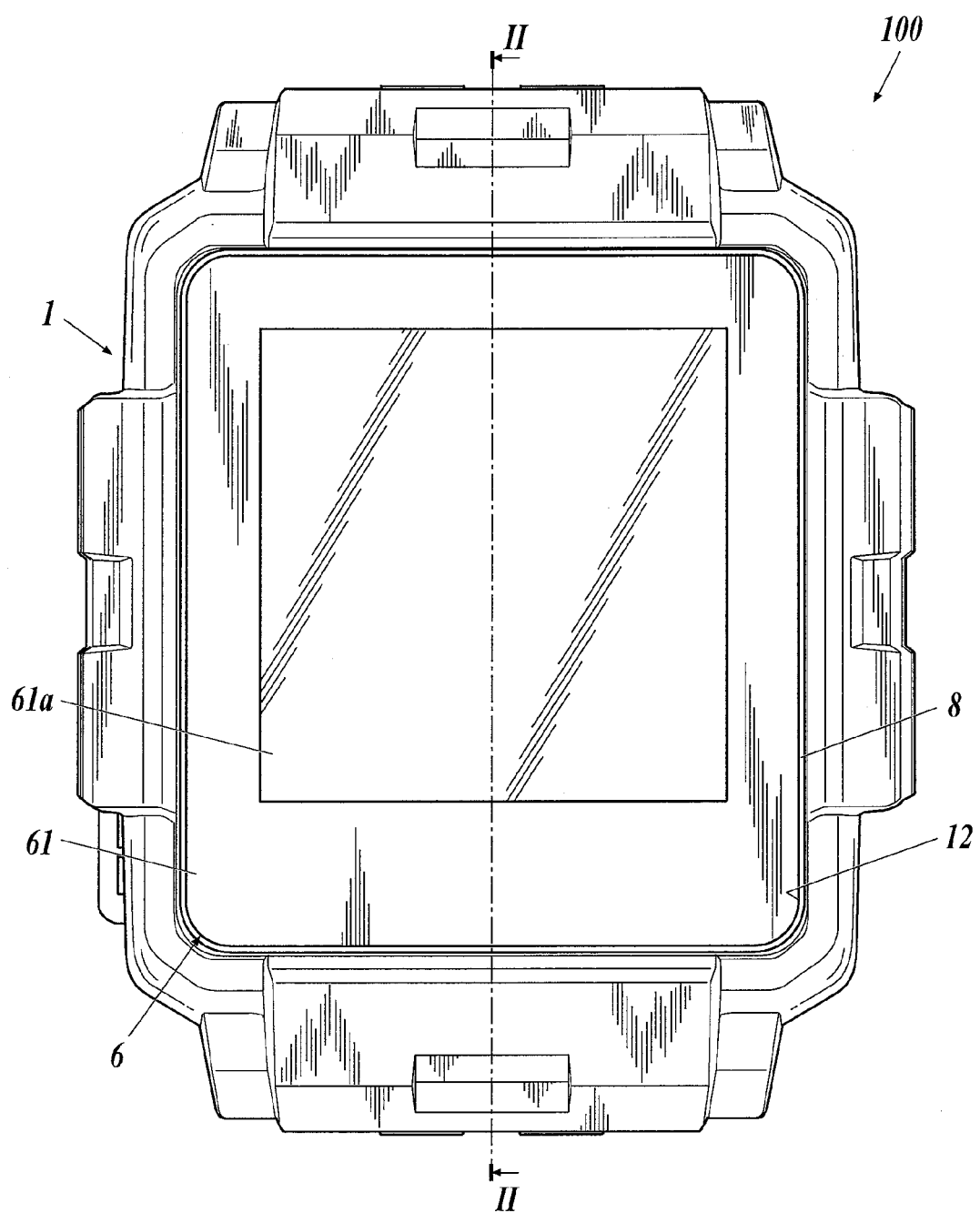
FIG. 1 is a plan view of an electronic device according to an embodiment of the present invention.
Figure 2:
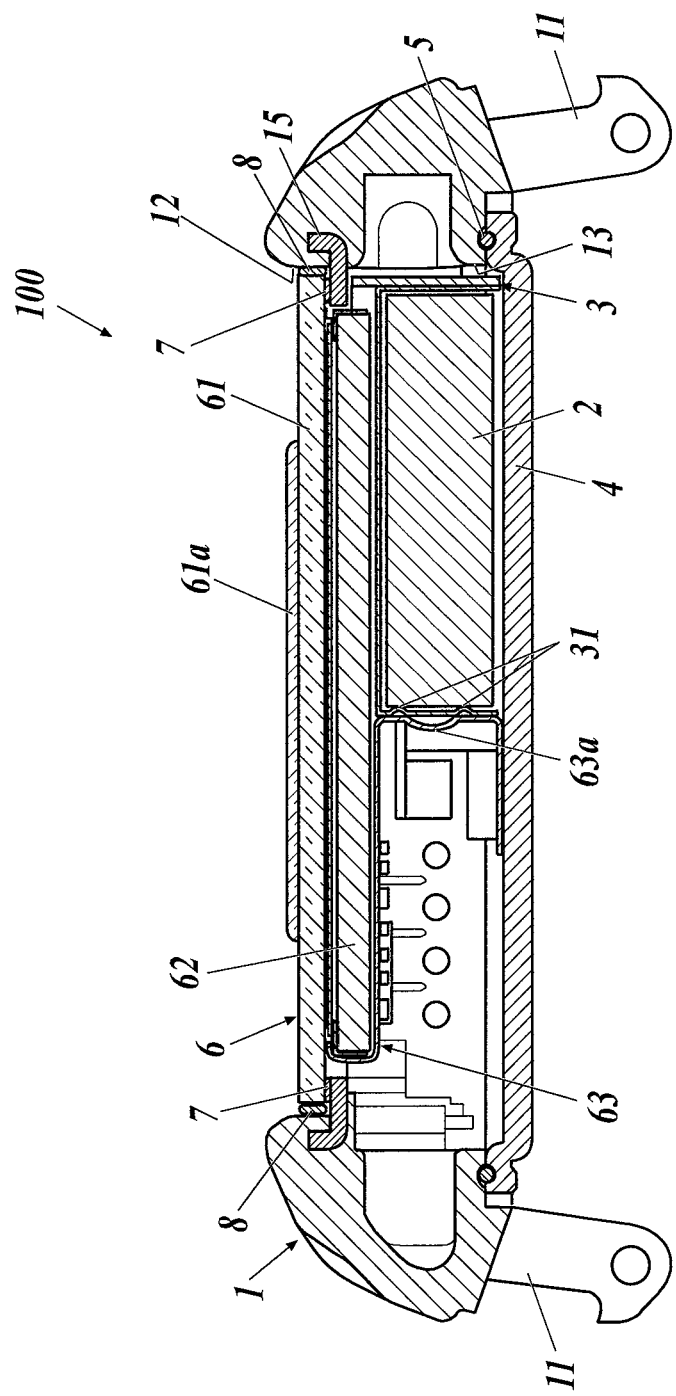
FIG. 2 is a sectional side view of the electronic device taken along the line II-II of FIG. 1.
Figure 3:
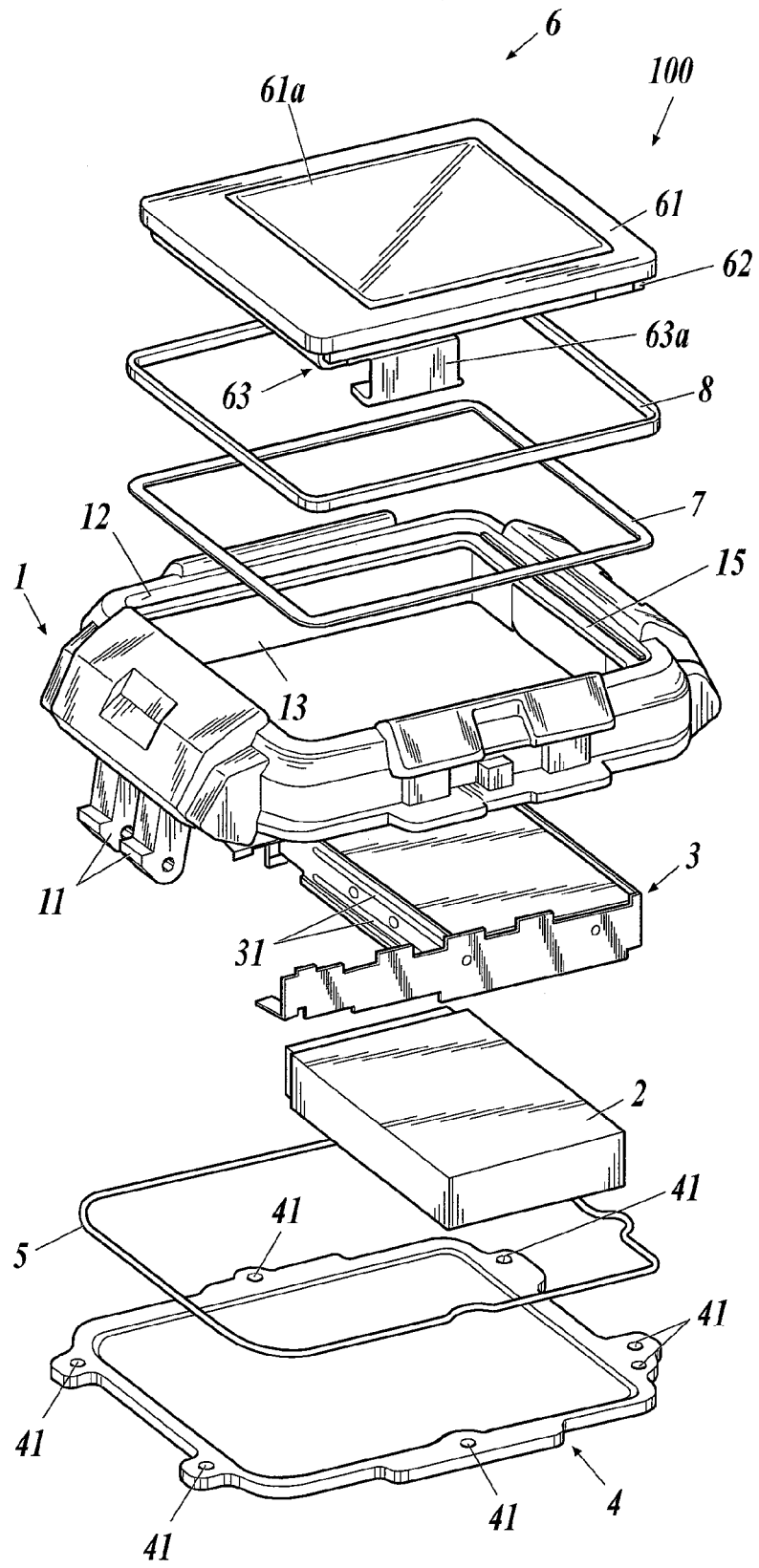
FIG. 3 is an exploded perspective view of the electronic device of FIG. 1.
Figure 4:
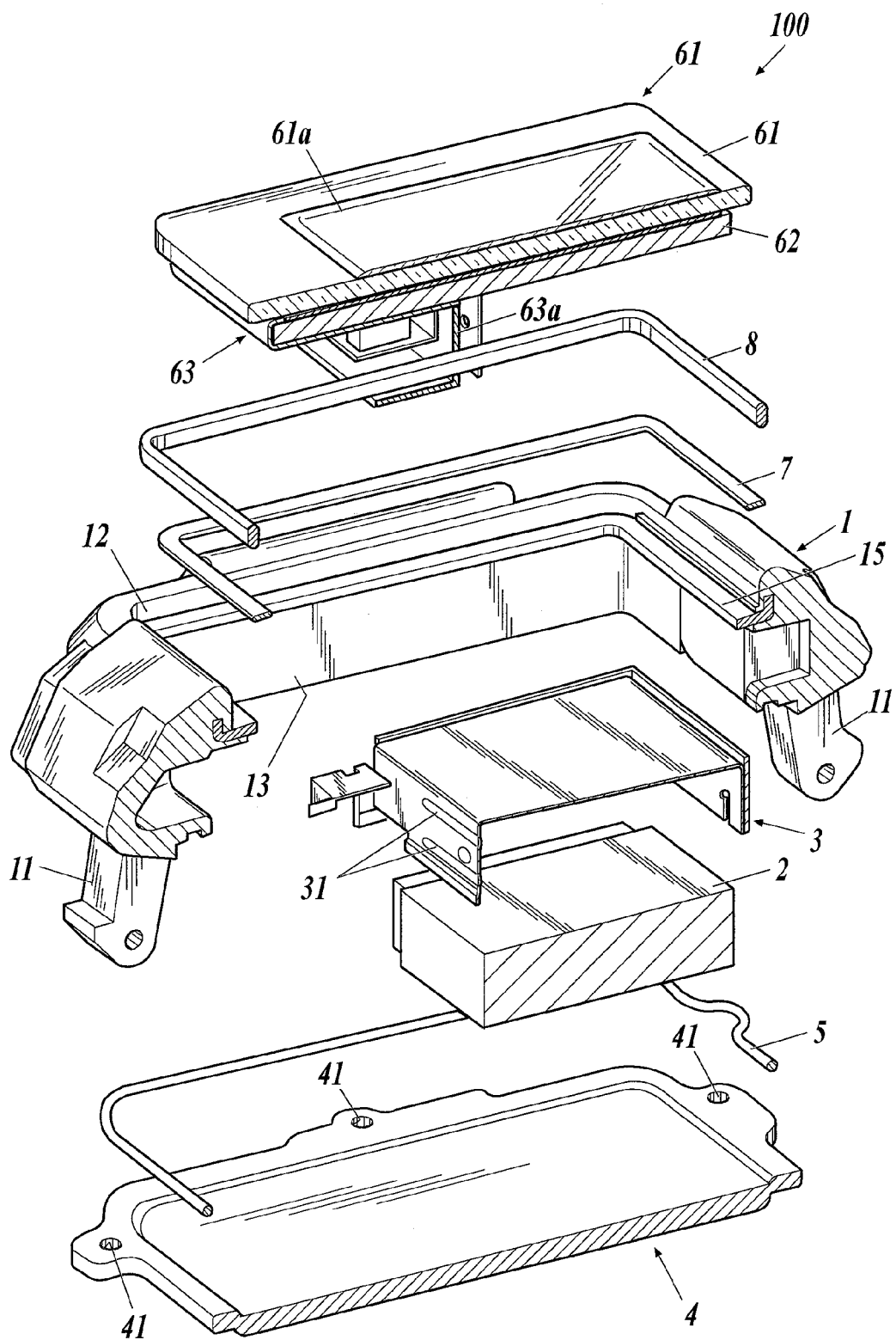
FIG. 4 is an exploded perspective view of the sectioned electronic device of FIG. 2.

FIG. 1 is a plan view of the electronic device according to the embodiment of the present invention, and FIG. 2 is a sectional side view of the electronic device taken along the line II-II of FIG. 1. FIG. 3 is an exploded perspective view of the electronic device, and FIG. 4 is an exploded perspective view of the sectioned electronic device of FIG. 2.

As illustrated in FIGS. 1 to 4, the electronic device 100 includes a case body 1 that is formed in the shape of a hollow short column.

On the outer face of the case body 1, band attachments 11 for attaching a band (not shown) are formed at both upper and lower ends in FIG. 1 (i.e. at the ends in the directions of twelve o'clock and six o'clock of a watch).

In the embodiment, the case body 1 is made of, for example, a resin material or a metal material such as stainless steel and titanium. The case body 1 may be made of any material, including materials other than those listed above.

Inside the case body 1, a lithium-ion battery 2 is housed, which serves as a battery for supplying an electric power to each functional component of the electronic device 100.

The lithium-ion battery 2 is disposed in the case body 1 where it is housed in an inner frame 3 that includes contacts 31. The inner frame 3 is fixed in the case body 1 by being screwed or the like so as to position the lithium-ion battery 2.

In the embodiment, the lithium-ion battery 2 is configured to be chargeable from outside while being housed in the case body 1.

Further, to the contacts 31 of the inner frame 3, a terminal portion 63a of flexible printed circuits 63 (hereinafter referred to as "FPC 63"), which will be mentioned later, is electrically connected.

Further, the case body 1 of the embodiment includes an upper opening 12 on the display side of the electronic device 100 (upper side in FIG. 3 and FIG. 4), and a lower opening 13 on the back side of the electronic device 100 (lower side in FIG. 3 and FIG. 4).

An inward flange 15 is attached on the internal circumference of the upper opening 12. The inward flange 15 may be formed separately from the case body 1 and be fixed on the case body 1 by being fitted in or the like. Alternatively, the inward flange 15 may be integrally formed with the case body 1.

In the embodiment, as illustrated in FIGS. 3 and 4, the inward flange 15 is provided over the entire internal circumference of the upper opening 12. However, the position of the inward flange 15 is not limited thereto. The inward flange 15 may be partly provided along the internal circumference of the upper opening 12.

On the lower side of the case body 1 (the lower side in FIG. 3 and FIG. 4, or the back side of the electronic device 100), a case back 4 is attached via a waterproof ring 5 made of a resin or the like so as to cover the lower opening 13 on the back side.

Specifically, as illustrated in FIG. 3 and FIG. 4, screw holes 41 are formed along the outer edge of the case back 4. For attaching the case back 4, the waterproof ring 5 is interposed between the case back 4 and the case body 1, and screws (not shown) are inserted in the screw holes 41. With this structure, the back case 4 is screwed on the back side of the case body 1, and the lower opening 13 is covered in an airtight manner.

Alternatively, the case body 1 and the case back 4 may be integrally molded with each other so that the lower opening 13 is not formed on the lower side of the case body 1.

On the display side of the case body 1, a display panel 6 is mounted on the inward flange 15 of the upper opening 12 so as to cover the upper opening 12.

In the embodiment, the display panel 6 includes a liquid crystal panel 61 that is formed by laminating a liquid crystal layer between glass substrates (not shown), and a back light 62 disposed on the back side of the liquid crystal panel 61. On the liquid crystal panel 61, a cover glass 61a for protecting a display area of the liquid crystal panel 61 is overlaid.

In the embodiment, the back light 62 is slightly smaller than the liquid crystal panel 61, and the inward flange 15 receives the rim part of the liquid crystal panel 61 on the back side.

Further, the liquid crystal panel 61 and the back light 62 are connected to the FPC (flexible printed circuits) 63.

On the FPC 63, electric circuits for driving the liquid crystal panel 61, the back light 62 and the like, and other electric circuits or the like for executing a variety of processing of the electronic device 100 are provided.

As described above, the terminal portion 63a of the FPC 63 is electrically connected to the contacts 31 of the inner frame 3 so that an electric power can be supplied from the lithium-ion battery 2 via the contacts 31.

Between the display panel 6 and the inward flange 15, an adhesive layer 7 is provided, and the display panel 6 is disposed on the inward flange 15 via the adhesive layer 7.

The adhesive layer 7 of the embodiment comprises an adhesive member that includes a foam. Specifically, the adhesive layer 7 is a foam-based double-sided adhesive tape for example.

The thickness of a foam-based double-sided adhesive tape of the adhesive layer 7 is approximately 0.2 mm. However, the thickness of the adhesive layer 7 is not limited thereto, and may be suitably selected according to the whole size of the electronic device 100, the thickness of the case body 1 and the like.

For example, the foam-including adhesive member, such as a form-based double-sided adhesive tape, is a laminate of an acrylic special adhesive, a special polyolefin foam and the like.

Such foam-including adhesive members are flexible, and therefore have high shape conformability. Further, when they are pulled in the adhesion direction, the foams stretch in the tearing direction while they are being peeled off. Therefore, they are not peeled off in a moment, and exhibit moderate tensile strength.

The configuration and material of the foam-including adhesive member are not limited to the above-described example.

In the embodiment, the adhesive layer 7 is provided over the entire area between the inward flange 15 and the display panel 6.

Further, the adhesive layer 7 is configured such that the adhesion force is lower at a certain part than the other part. Specifically, for example, a portion having a narrower width than other portions is formed in a certain part of the adhesive layer 7 along the circumference (e.g. in one of the four sides in FIG. 1, etc.). In another example, portions of the adhesive layer 7 around the corners of the case body 1 are made narrower than other portions. Thereby a portion which has a lower adhesion force and which is therefore peeled off more easily than other portions is provided. Further, even when the adhesive layer 7 has a constant width, a portion that has a low adhesion force and is therefore peeled off easily is provided by partly changing the thickness of the adhesive layer 7 or the type, composition or the like of the adhesive of the adhesive layer 7.

Figure 5:
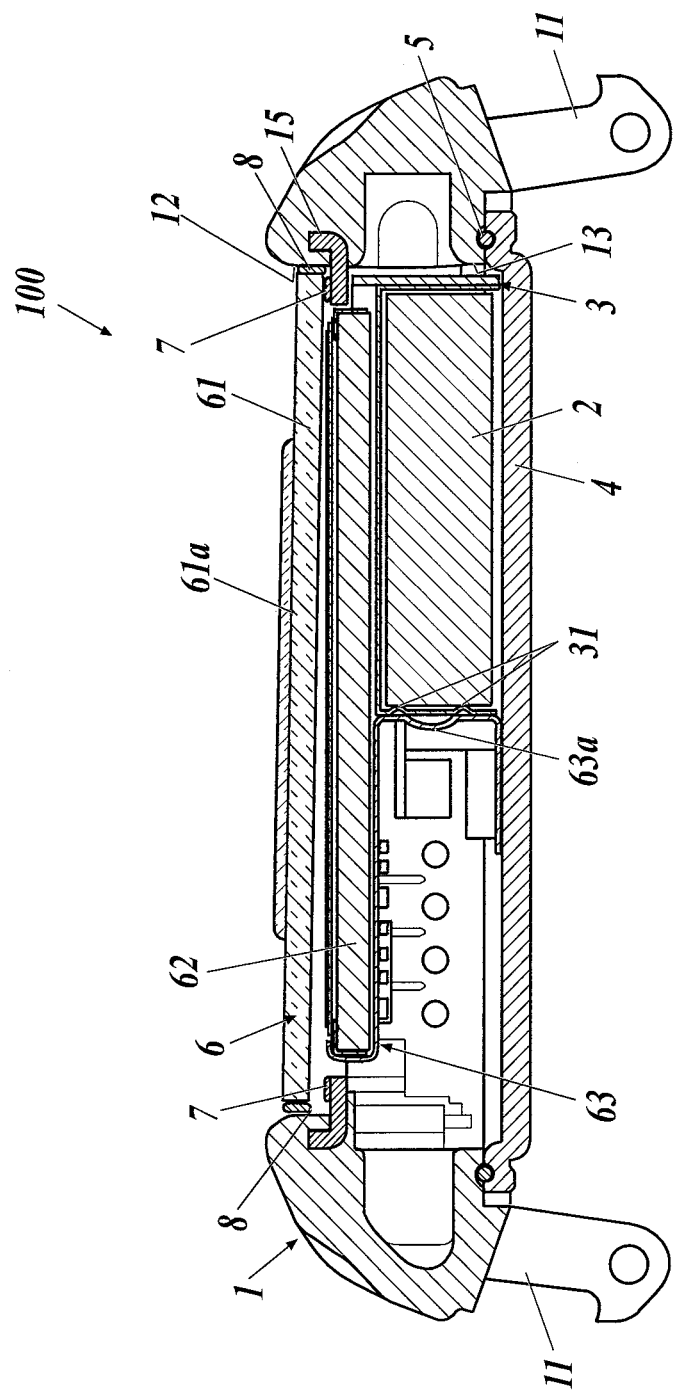
FIG. 5 is a sectional side view of the electronic device in which an adhesive layer 7 is peeled off by the increased inner pressure of the case body 1.

By providing the portion that has the lower adhesion force and is therefore peeled off more easily, when the increased inner pressure of the space pushes out the display panel 6 outward as illustrated in FIG. 5, the adhesive layer 7 is gradually peeled off, starting with the portion that is peeled off more easily. The adhesive layer 7 is less resistant to the inner pressure of the case body 1 (the space) than the display panel 6 and the case body 1. That is, the capacity to prevent the display panel 6 from being separated (popping up) from the case body 1 by the action of the inner pressure or the capacity to prevent breakage of the display panel 6 and the case body 1 by the action of the inner pressure is greater than the capacity to prevent the adhesive layer 7 from being separated (dissociated) from the display panel 6 or the inward flange 15 (resistance to peeling off).

Therefore, the adhesive layer 7 is gradually peeled off before the display panel 6 or the case body 1 breaks or the display panel 6 swiftly pops out of the case body due to the inner pressure, which prevents the display panel 6 or the case body 1 from breakage or the display panel 6 from swiftly popping outward. For example, in a case of a terminal device that is worn around his/her wrist of a user, a gap is formed between the inward flange 15 and the display panel 6 when the adhesive layer 7 is peeled off, which can prevent the display panel 6 from popping out of the upper opening 12 in the direction perpendicular to the case body 1 and the arm of the user. Therefore, accidents can be prevented, such as injury of the user wearing the terminal device or a person near the device.

Further, between the internal circumference of the upper opening 12 and the outer circumference of the display panel 6 (liquid crystal panel 61 in the embodiment), a waterproof ring 8 is provided as a packing along the internal circumference of the upper opening 12.

The waterproof ring 8 is made of, for example, a synthetic resin such as fluororesin. However, the material of the waterproof ring 8 is not limited thereto.

The display panel 6 is fitted (press-fitted) and fixed in the upper opening 12 of the case body 1 via the waterproof ring 8.

This configuration allows the display panel 6 to be in close contact with the internal circumference of the upper opening 12 of the case body 1 via the waterproof ring 8 so as to cover the upper opening 12 in an airtight manner.

Next, the functions of the electronic device 100 according to the embodiment will be described.

In the embodiment, to assemble the electronic device 100, the case back 4 is attached on the lower side of the case body 1 via the waterproof ring 5. Then, the lithium-ion battery 2, which is housed in the inner frame 3, is housed in the case body 1.

Furthermore, the adhesive layer 7 is pasted on the inward flange 15 which is provided on the internal circumference of the upper opening 12, and the display panel 6 is then mounted thereon. In this step, the waterproof ring 8 is disposed between the outer circumference of the liquid crystal panel 61 of the display panel 6 and the internal circumference of the upper opening 12 of the case body 1 so that the display panel 6 fits in (is press-fitted in) the upper opening 12 of the case body 1 via the waterproof ring 8 to cover the upper opening 12 in an airtight manner.

When the electronic device 100 is dropped on a floor or the like and the lithium-ion battery 2 is deformed or is subject to an impact, or when the lithium-ion battery 2 is left in a high-temperature environment for a long time, gas may be produced from the lithium battery 2 to increase the inner pressure of the case body 1. In such case, the display panel 6 is pressed in the direction of pushing it out of the upper opening 12 (the upper direction in FIG. 3 and FIG. 4). The pressure tries to detach the display panel 6 from the waterproof ring 8, and to make it pop out of the upper opening 12. At this moment, as illustrated in FIG. 5, the adhesive layer 7, which bonds the inward flange 15 with the display panel 6, is gradually peeled off, starting with the portion having a low adhesion force (e.g. the portion having a narrow width), and the peeled part releases the gas to decrease the inner pressure of the case body 1. As a result, the display panel 6 is prevented from popping out of the upper opening 12.

As described above, according to the embodiment, since the display panel 6 is attached to the case body 1 via a waterproof ring 8, high air tightness and waterproofness is provided. Further, even if gas is produced from the lithium-ion battery 2 to increase the inner pressure of the case body 1, the adhesive layer 7, which bonds the inward flange 15 with the display panel 6, prevents the display panel 6 from popping up. As a result, the display panel 6 and the case body 1 are prevented from being broken. Also, a user wearing the electronic device 100, a person near the electronic device 100 and something around the electronic device 100 are prevented from being hurt or broken by the popped display panel 6.

Further, in the embodiment, when the adhesive layer 7 is provided over the entire area between the inward flange 15 and the display panel 6, the portion having a low adhesion force than the other portion (e.g. the portion having a narrower width) is formed in a part of the adhesive layer 7. Accordingly, when the inner pressure of the case body 1 increases, the display panel 6 is not instantly but gradually peeled off starting with the portion where the adhesion force of the adhesive layer 7 is low, and the gas is released from the peeled part. As a result, the inner pressure of the case body 1 is reduced, and the display panel 6 is prevented from swiftly popping out of the upper opening 12.

Further, when the adhesive layer 7 comprises a foam-including adhesive member as in the embodiment, when the inner pressure of the case body 1 increases to press the display panel 6 in the direction of peeling it from the inward flange 15, the foam stretches in the tearing direction while the adhesive layer is being peeled off. As a result, the adhesive layer 7 is not peeled off in a moment, and the display panel 6 is prevented from swiftly popping out of the upper opening 12.

Further, when the lithium-ion battery 2 is used for a battery, this battery can provide a large amount of electric power necessary for the variety of operations and processing with a comparatively small size and a light-weight. In the embodiment, even if gas is produced from this lithium-ion battery 2, the gas is slowly released to reduce the inner pressure of the case body 1. Therefore, accidents such as popping up of the display panel 6 is prevented.

While the embodiment of the present invention is described in the foregoing, it should be understood that the present invention is not limited to the embodiment, and a variety of changes and modifications can be made without departing from the present invention.

For example, in the embodiment, the lithium-ion battery 2 is provided for a battery. However, the battery is not limited to the lithium-ion battery 2.

The present invention is widely applicable in the situations where a battery used may produce gas or explode when it is subjected to an external impact or when it is left in a high-temperature environment for a long time.

Further, in the embodiment, the adhesive layer 7 is provided over the entire area between the inward flange 15 and the display panel 6. However, the area to which the adhesive layer 7 is provided is not limited thereto. For example, a part of the area between the inward flange 15 and the display panel 6 may not be provided with the adhesive layer 7.

Further, in the embodiment, the adhesive layer 7 is configured such that a certain part of the adhesive layer 7 has a lower adhesion force than the other part. However, the configuration of the adhesive layer 7 is not limited thereto. The adhesion of the adhesive layer may be uniform over the whole area.

For example, in the case where a part of the area between the inward flange 15 and the display panel 6 is not provided with the adhesive layer 7 as described above, the display panel 6 is gradually peeled off, starting with the part without the adhesive layer 7 and with the surrounding part thereof, when the display panel 6 is pressed outward by the increased inner pressure. Therefore, even if the adhesion force of the adhesive layer 7 is uniform over the whole area, the display panel 6 is prevented from swiftly popping up.

Further, in the embodiment, the adhesive layer 7 comprises a foam-based double-sided adhesive tape. However, the adhesive layer 7 is not limited to foam-including adhesive members such as foam-based double-sided adhesive tape.

For example, it may be composed of a common double-sided adhesive tape.

Further, the adhesive layer 7 may not be composed of a double-sided adhesive tape but of a layer of adhesive. In this case, it is preferred that the adhesive of the adhesive layer 7 is of the type that has a moderate tensile strength and is not easily peeled off in a moment.

Further, in the embodiment, the display panel 6 is a liquid crystal display panel that includes the liquid crystal panel 61 and the back light 62. However, the display panel 6 is not limited to liquid crystal display panels. For example, it may be a display panel of organic EL (electroluminescence) or the like.

Further, in the above-described embodiment, the electronic device 100 is a wristwatch terminal device for sports. However, the electronic device 100 is not limited thereto.

The present invention is applicable to comparatively small devices that require high waterproofness and do not structurally have an escape route for gas produced from a battery.

Further, in the embodiment, the display panel 6 has an approximately rectangular shape. However, the shape of the display panel 6 is not limited thereto. For example, the display panel 6 may have an approximately circular shape. In this case, the case body 1 may also have an approximately circular shape in the plan view in conformity to the shape of the display panel 6, or the case body 1 may have a rectangular shape or the like in the plan view.

While some embodiments of the present invention are described, the scope of the present invention is not limited to the above-described embodiments, but includes the scope of the claims and the full scope of their equivalents.

What is claimed is:

1. An electronic device, comprising:
    a case body which includes a battery holder holding a battery and an inner wall that defines an opening;
    an inward flange which is provided at at least a part of a circumference of the inner wall;
    a display panel which is mounted on the inward flange so as to cover the opening of the case body;
    a packing which is provided between the inner wall and an outer circumference of the display panel; and
    an adhesive layer which is provided between the display panel and the inward flange and which is provided under the packing,
    wherein the adhesive layer is separate from the packing and is adapted to gradually peel off to leak gas in a space sealed by the case body and the display panel, so as to prevent the display panel from swiftly popping out of the opening when an inner pressure of the space increases.

2. The electronic device according to claim 1,
    wherein the adhesive layer is provided in at least a part of an area between the inward flange and the display panel, and
    wherein at least a part of the adhesive layer has an adhesion force lower than the other part of the adhesive layer.

3. The electronic device according to claim 1,
    wherein the adhesive layer is provided over an entire area between the inward flange and the display panel, and
    wherein at least a part of the adhesive layer has an adhesion force lower than the other part of the adhesive layer.

4. The electronic device according to claim 1,
    wherein the adhesive layer is provided in at least a part of an area between the inward flange and the display panel, and
    wherein the adhesive layer has a uniform adhesion force over the entire adhesion layer.

5. The electronic device according to claim 1,
    wherein the adhesive layer is provided over an entire area between the inward flange and the display panel, and
    wherein the adhesive layer has a uniform adhesion force over the entire adhesion layer.

6. The electronic device according to claim 1, wherein the adhesive layer comprises an adhesive member which includes a foam.

7. The electronic device according to claim 1, wherein the display panel is mounted on the inward flange via the adhesive layer, and is fitted in the opening of the case body.

8. The electronic device according to claim 1, wherein the battery includes a lithium-ion battery.

9. The electronic device according to claim 1, wherein the display panel is mounted on the inward flange via the adhesive layer, and is fitted in the opening of the case body via the packing.

10. The electronic device according to claim 1,
    wherein the electronic device is a terminal device that is wearable around a wrist of a user, and
    wherein the adhesive layer is configured to be gradually peeled off to leak gas in the space, starting with a part which is easily peeled off, when the inner pressure of the space increases, so as to prevent the display panel from swiftly popping out of the opening.

11. The electronic device according to claim 1, wherein the display panel is mounted above the inward flange so as to cover the opening of the case body.

12. An electronic device, comprising:
    a case body which includes a battery holder holding a battery and an inner wall that defines an opening;
    an inward flange which is provided at at least a part of a circumference of the inner wall;
    a display panel which is mounted on the inward flange so as to cover the opening of the case body; and
    an adhesive layer which is provided between the display panel and the inward flange and which is under the display panel,
    wherein the adhesive layer is adapted to gradually peel off to leak gas in a space sealed by the case body and the display panel, so as to prevent the display panel from swiftly popping out of the opening when an inner pressure of the space increases.

13. The electronic device according to claim 12,
    wherein the adhesive layer is provided in at least a part of an area between the inward flange and the display panel, and
    wherein at least a part of the adhesive layer has an adhesion force lower than the other part of the adhesive layer.

14. The electronic device according to claim 12,
    wherein the adhesive layer is provided over an entire area between the inward flange and the display panel, and
    wherein at least a part of the adhesive layer has an adhesion force lower than the other part of the adhesive layer.

15. The electronic device according to claim 12,
    wherein the adhesive layer is provided in at least a part of an area between the inward flange and the display panel, and
    wherein the adhesive layer has a uniform adhesion force over the entire adhesion layer.

16. The electronic device according to claim 12,
wherein the adhesive layer is provided over an entire area between the inward flange and the display panel, and
wherein the adhesive layer has a uniform adhesion force over the entire adhesion layer.

17. The electronic device according to claim 12, wherein the adhesive layer comprises an adhesive member which includes a foam.

18. The electronic device according to claim 12, wherein the battery includes a lithium-ion battery.

19. The electronic device according to claim 12, further comprising:
a packing which is disposed between an inner circumference of the inner wall that defines the opening and an outer circumference of the display panel,
wherein the display panel is mounted on the inward flange via the adhesive layer, and is fitted in the opening of the case body via the packing.

20. The electronic device according to claim 12, wherein the display panel is mounted above the inward flange so as to cover the opening of the case body.

* * * * *